(12) United States Patent
Zhong

(10) Patent No.: US 8,378,679 B2
(45) Date of Patent: Feb. 19, 2013

(54) COHERENT SIGNAL ACQUISITION SYSTEM FOR MR IMAGING AND SPECTROSCOPY

(75) Inventor: Xiaodong Zhong, Atlanta, GA (US)

(73) Assignee: Siemens Medical Solutions USA, Inc., Malvern, PA (US)

(*) Notice: Subject to any disclaimer, the term of this patent is extended or adjusted under 35 U.S.C. 154(b) by 429 days.

(21) Appl. No.: 12/816,420

(22) Filed: Jun. 16, 2010

(65) Prior Publication Data

US 2011/0133736 A1     Jun. 9, 2011

Related U.S. Application Data

(60) Provisional application No. 61/266,672, filed on Dec. 4, 2009.

(51) Int. Cl.
*G01V 3/00* (2006.01)
(52) U.S. Cl. ...................................... 324/309
(58) Field of Classification Search ........... 324/300–322
See application file for complete search history.

(56) References Cited

U.S. PATENT DOCUMENTS

| | | | |
|---|---|---|---|
| 4,680,546 A | 7/1987 | Dumoulin | |
| 5,027,072 A | 6/1991 | Rinaldi | |
| 6,373,250 B1 | 4/2002 | Tsoref et al. | |
| 7,253,620 B1* | 8/2007 | Derbyshire et al. | 324/307 |
| 7,880,466 B2* | 2/2011 | Derbyshire et al. | 324/307 |
| 8,228,060 B2* | 7/2012 | Busse | 324/307 |

OTHER PUBLICATIONS

J. Tsao and D. Laurent, "N-SPAMM for efficient displacement-encoded acquisition in myocardial tagging", Proc. International Society Resonance Medicine 13, p. 273(2005).

Frederick H. Epstein and Wesley D. Gilson, "Displacement-Encoded Cardiac MRI Using Cosine and Sine Modulation to Eliminate (CANSEL) Artifact-Generating Echoes", Magnetic Resonance in Medicine 53:774-781, 2004.
A. Rutz et al., Implementation of 3-SPAMM for Myocardial Motion Analysis with HARP, Proc. International Society Magnetic Resonance Medicine, 13, p. 774 (2005).
J.P. Kuijer et al., "CSPAMM Real-Part Reconstruction using an Internal Phase Reference", Proc. International Society Magnetic Resonance Medicine, 13, p. 276 (2005).
Peter B. Kingsley, "Product Operators, Coherence Pathways, and Phase Cycling Part I: Product Operators, Spin-Spin Coupling, and Coherence Pathways", Concepts in Magnetic Resonance, vol. 7(1) 29-47 (1995).
Peter B. Kingsley, "Product Operators, Coherence Pathways, and Phase Cycling Part II. Coherence Pathways in Multipulse Sequences: Spin Echoes, Stimulated Echoes, and Multiple-Quantum Coherences", Concepts in Magnetic Resonance, vol. 7(2) 115-136 (1995).
Peter B. Kingsley, "Product Operators, Coherence Pathways, and Phase Cycling. Part III: Phase Cycling", Concepts in Magnetic Resonance, vol. 7(3) 167-192 (1995).

(Continued)

*Primary Examiner* — Dixomara Vargas
(74) *Attorney, Agent, or Firm* — Alexander J Burke

(57) ABSTRACT

A system includes a computation processor for determining phase angles of RF pulses for use in acquiring MR signal data of a desired coherence pathway in response to, predetermined data indicating a number of coherence pathways in multiple MR datasets to be acquired, predetermined information indicating different types of MR signals present in the multiple MR datasets to be acquired and at least one phase equation selected in response to a corresponding at least one type of the types of MR signals present in the MR datasets to be acquired. The number of coherence pathways represents a corresponding number of groups of protons having substantially the same proton spin precession angle. An RF signal generator generates RF pulses for acquiring multiple MR datasets including MR signal data of the desired coherence pathway using the determined phase angles. Multiple MR datasets are acquired using the generated RF pulses.

20 Claims, 4 Drawing Sheets

OTHER PUBLICATIONS

Paul A. Bottomley, "Spatial Localization in NMR Spectroscopy in Vivo", Ann N Y Acad Sci 1987;508:333-348.

Jens Frahm et al., "Localized Proton Spectroscopy Using Stimulated Echoes", Journal of Magnetic Resonance 72, 502-508 (1987).

Saadllah Ramadan, "Phase-Rotation in In-Vivo Localized Spectroscopy", Concepts in Magnetic Resonance Part A, vol. 30A(3), 147-153 (2007).

Jack Knight-Scott et al., "A phase rotation scheme for achieving very short echo times with localized stimulated echo spectroscopy", Magnetic Resonance Imaging 23 (2005) 871-876.

J. Hennig, "The Application of Phase Rotation for Localized in Vivo Proton Spectroscopy with Short Echo Times", Journal of Magnetic Resonance 96, 40-49 (1992).

Anthony H. Aletras et al., "DENSE: Displacement Encoding with Stimulated Echoes in Cardiac Functional MRI", Journal of Magnetic Resonance 137, 247-252 (1999).

Daniel Kim, et al., "Myocardial Tissue Tracking with Two-dimensional Cine Displacement-encoded MR Imaging: Development and Initial Evaluation", Radiology, vol. 230, No. 3, pp. 862-871.

Nael F. Osman, et al., Cardiac Motion Tracking Using CINE Harmonic Phase (HARP) Magnetic Resonance Imaging, Magnetic Resonance in Medicine 42:1048-1060 (1999).

Richard R. Ernst, et al., "Two-Dimensional Fourier Spectroscopy", Principles of Nuclear Magnetic Resonance in One and Two Dimensions, International Series of Monographs on Chemistry—14, pp. 292-298 (2004).

Dwight G. Nishimura, "Rotation Matrics", Principes of Magnetic Resonance Imaging, pp. 25-27.

Peter Webb, et al., "Lactate Imaging using Multiple Quantum Methods", Soc Magn Reson Med 1988;2:758.

* cited by examiner

FIGURE 3

| Signal | Phase Equation (P) |
|---|---|
| FID 1 | $\theta_1$ |
| FID 2 | $\theta_2$ |
| FID 3 | $\theta_3$ |
| SE 12 | $2\theta_2 - \theta_1$ |
| SE 13 | $2\theta_3 - \theta_1$ |
| SE 23 | $2\theta_3 - \theta_2$ |
| STEAM N | $\theta_3 + \theta_2 - \theta_1$ |
| STEAM P | $\theta_3 - \theta_2 + \theta_1$ |
| SEE | $2\theta_3 - 2\theta_2 + \theta_1$ |
| DQF 1 | $-\theta_3 + 3\theta_2 - \theta_1$ |
| DQF 2 | $3\theta_3 - \theta_2 - \theta_1$ |
| DQF 3 | $-\theta_3 + \theta_2 + \theta_1$ |
| DQF 4 | $3\theta_3 - 3\theta_2 + \theta_1$ |

COHERENT SIGNAL ACQUISITION SYSTEM FOR MR IMAGING AND SPECTROSCOPY

This is a non-provisional application of provisional application Ser. No. 61/266,672 filed 4 Dec., 2009, by X. Zhong.

FIELD OF THE INVENTION

This invention concerns a system for processing an MR dataset to provide an MR signal generated by a group of protons having substantially the same proton spin precession angle.

BACKGROUND OF THE INVENTION

Many magnetic resonance (MR) sequences generate data which contains signals in multiple coherence pathways representing groups of protons having substantially the same proton spin precession angle. Usually only the signal in one certain coherence pathway is desired. If this signal cannot be isolated, or the other unwanted signals cannot be suppressed, errors occur in the results. Many magnetic resonance (MR) pulse sequences contain multiple radio-frequency (RF) pulses to prepare the magnetization before acquiring the data. Some examples include spectroscopy techniques such as stimulated echo acquisition mode (STEAM) single voxel spectroscopy, point resolved spectroscopy (PRESS) and double-quantum filtered (DQF) spectroscopy, and imaging techniques such as displacement-encoding with stimulated echoes (DENSE) and harmonic phase analysis (HARP). In the acquired data of these sequences, signals from multiple coherence transfer pathways (CTPs) exist. Depending on the applications, usually only the signal in one certain coherence pathway is desired. If this signal cannot be isolated, or the other unwanted signals cannot be eliminated, then the acquired data is contaminated as ghosting artifacts and poor signal-to-noise ratio (SNR) can be seen and this leads to inaccurate results.

Known systems use phase cycling to address this problem, where desired signals add coherently and unwanted signals add destructively. This selective constructive or destructive addition can be achieved by carefully cycling the phases of the RF pulses to particular values. In the initial implementations of phase cycling, data from various imaging scans is averaged by saving data in the same memory location. Therefore, at the end of acquisition, various original phase cycling scans cannot be inspected separately. Moreover, only the desired signal in certain coherence pathway is available. The signals in other coherence pathways cannot be inspected, although in most cases there is no need to inspect them.

Known systems also use phase rotation to address shortcomings of phase cycling in localized spectroscopy. In phase rotation, the phases of the RF pulses are still carefully set to cycle among particular values, and data from various imaging scans is stored as rows in a two-dimensional (2D) matrix. After the data acquisition, a one-dimensional (1D) Fourier transform is performed in the column direction on this matrix, and a specific row of this transformed matrix is extracted to represent the 1D free induction decay (FID) containing only the desired signal in a certain coherence pathway, while some other particular rows contain the signals in the unwanted coherence pathways. Other post-processing such as zero-padding and frequency/phase correction may be applied on the rows, and followed by a 1D Fourier transform in the row direction to obtain a resultant 2D matrix, having rows comprising 1D spectra of the corresponding signals in different coherence pathways. Phase rotation therefore enables inspection of spectra of the separated signal in different coherence pathways at the same time by observing an overall view represented by a resultant 2D matrix.

Some imaging techniques, such as displacement-encoding with stimulated echoes (DENSE) and harmonic phase analysis (HARP), have a similar need to isolate the specific signal in one certain pathway. Known systems use variants of phase cycling methods to isolate desired stimulated echo signals. In known systems, phase cycling steps need to achieve the effect that desired signals add coherently and unwanted signals add destructively and planning phase cycling methods is difficult. In addition, known phase cycling methods typically use a simple average to only acquire a desired signal, and are unable to concurrently acquire unwanted signals. A system according to invention principles addresses these deficiencies and related problems.

SUMMARY OF THE INVENTION

A system provides phase cycling to separate MR signals in different coherence pathways without contamination to isolate signals in other coherence pathways and in one embodiment the system provides phase cycling without the need to solve linear equations. A system processes an MR dataset to provide an MR signal generated by a group of protons having substantially the same proton spin precession angle. The system includes a computation processor for determining phase angles of RF pulses for use in acquiring MR signal data of a desired coherence pathway in response to, predetermined data indicating a number of coherence pathways in multiple MR datasets to be acquired, predetermined information indicating different types of MR signals present in the multiple MR datasets to be acquired and at least one phase equation selected in response to a corresponding at least one type of the types of MR signals present in the MR datasets to be acquired. The number of coherence pathways represents a corresponding number of groups of protons having substantially the same proton spin precession angle. An RF signal generator generates RF pulses for acquiring multiple MR datasets including MR signal data of the desired coherence pathway using the determined phase angles. An MR imaging device performs multiple MR scans to provide the multiple MR datasets using the generated RF pulses.

BRIEF DESCRIPTION OF THE DRAWING

FIG. 3 shows a table indicating signals in a three-pulse sequence and their corresponding phase equations.

DETAILED DESCRIPTION OF THE INVENTION

Definitions

Coherence pathway, or phase coherence, is a term describing an MR signal generated by a group of protons having substantially the same proton spin precession angle and is associated with the degree, to which processing nuclear spins are synchronous. Multiple coherence pathways may exist in the signal of one MR pulse sequence. An acquired MR signal is often a sum of both wanted and unwanted coherence pathways.

Phase cycling is a method used to suppress unwanted coherence pathways and isolate a wanted coherence pathway, in an MR signal. Phase cycling involves performing the same imaging scan multiple times, but for each scan the phase of some RF pulses is varied, so that the phase of MR signal of each scan (also the phase of coherence pathways of the MR signal of each scan) is different. By adding these scans (sometimes with some calculated weighting factors), the wanted coherence pathway is obtained from an MR signal (which may be presented as images or spectroscopy data).

Phase rotation is used for a similar purpose as phase cycling. Phase rotation involves performing multiple scans with variable phase values of some RF pulses. But these values need to be more carefully selected than in the phase cycling case, so that the phase rotation data from multiple scans may be used in a matrix with one additional dimension and be Fourier Transformed in a specific direction to isolate MR signals (for presentation as images or spectroscopy data) containing exclusively the wanted coherence pathway.

A system according to invention principles provides phase cycling in MR pulse sequences to separate signals in all or a portion of coherence pathways by generating and solving linear equations using acquired MR data and pre-calculated coefficients. This is illustrated in a sequence with three RF pulses, for example. The system isolates expected signals without contamination, and isolates signals in other coherence pathways as desired. The system is usable in different types of imaging including (but not limited to), (1) imaging using displacement-encoding with stimulated echoes (DENSE) and harmonic phase analysis (HARP), and (2) spectroscopy, such as stimulated echo acquisition mode (STEAM) single voxel spectroscopy, point resolved spectroscopy (PRESS) and double-quantum filtered (DQF) spectroscopy. In addition, in one embodiment phase rotation is provided (analogous to phase cycling in special cases) that provides convenient separation of the signals without the need of solving linear equations. The applications of this phase rotation method include but are not limited to, stimulated echo techniques such as DENSE imaging and STEAM single voxel spectroscopy.

Figure 1:
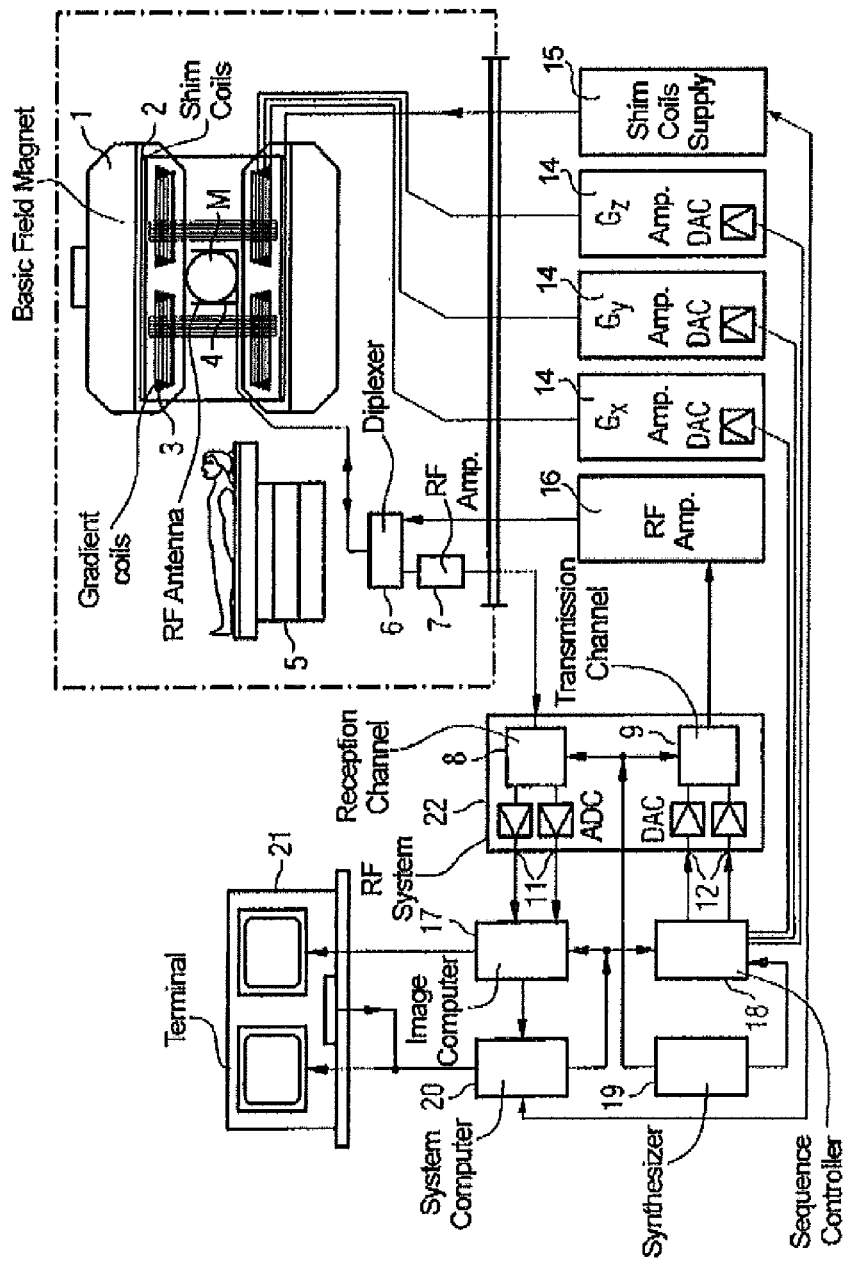
FIG. 1 shows a system for processing an MR dataset to provide an MR signal generated by a group of protons having substantially the same proton spin precession angle, according to invention principles.

FIG. 1 shows system 10 for processing an MR dataset to provide an MR signal generated by a group of protons having substantially the same proton spin precession angle. System 10 provides phase cycling to separate signals in all or a portion of coherence pathways by generating and solving linear equations using acquired MR data and pre-calculated coefficients. System 10 advantageously generates RF pulses for providing desired signals to add coherently and unwanted signals to add destructively and advantageously simplifies phase cycling. Moreover, the system isolates expected signals without contamination, and isolates signals in other coherence pathways as required. In addition, an advantageous phase rotation pulse sequence provides convenient separation of signals without need for solving linear equations. The applications of this phase rotation method include but are not limited to stimulated echo techniques.

A basic field magnet 1 generates a strong magnetic field, which is constant in time, for the polarization or alignment of the nuclear spins in the examination region of an object, such as, for example, a part of a human body to be examined. The high homogeneity of the basic magnetic field required for the magnetic resonance measurement is provided in a spherical measurement volume M, for example, into which the parts of the human body to be examined are brought. In order to satisfy the homogeneity requirements and especially for the elimination of time-invariant influences, shim-plates made of ferromagnetic material are mounted at suitable positions. Time-variable influences are eliminated by shim coils 2, which are controlled by a shim-current supply 15.

In the basic magnetic field 1, a cylinder-shaped gradient coil system 3 is used, which consists of three windings, for example. Each winding is supplied with current by an amplifier 14 in order to generate a linear gradient field in the respective directions of the Cartesian coordinate system. The first winding of the gradient field system 3 generates a gradient $G_x$ in the x-direction, the second winding generates a gradient $G_y$ in the y-direction, and the third winding generates a gradient $G_z$ in the z-direction. Each amplifier 14 contains a digital-analog converter, which is controlled by a sequence controller 18 for the generation of gradient pulses at proper times.

Within the gradient field system 3, radio-frequency (RF) coils 4 are located which convert the radio-frequency pulses emitted by a radio-frequency power amplifier 16 via multiplexer 6 into a magnetic alternating field in order to excite the nuclei and align the nuclear spins of the object to be examined or the region of the object to be examined. In one embodiment, RF coils 4 comprise a subset or substantially all of multiple RF coils arranged in sections along the length of volume M corresponding to the length of a patient. Further, an individual section RF coil of coils 4 comprises multiple RF coils providing RF image data that is used in parallel to generate a single MR image. RF pulse signals are applied to RF coils 4, which in response produces magnetic field pulses which rotate the spins of the protons in the imaged body by ninety degrees or by one hundred and eighty degrees for so-called "spin echo" imaging, or by angles less than or equal to 90 degrees for so-called "gradient echo" imaging. In response to the applied RF pulse signals, RF coils 4 receive MR signals, i.e., signals from the excited protons within the body as they return to an equilibrium position established by the static and gradient magnetic fields. The MR signals comprising nuclear spin echo signals received by RF coils 4 as an alternating field resulting from the precessing nuclear spins, are converted into a voltage that is supplied via an amplifier 7 and multiplexer 6 to a radio-frequency receiver processing unit 8 of a radio-frequency system 22.

The radio-frequency system 22 operates in an RF signal transmission mode to excite protons and in a receiving mode to process resulting RF echo signals. In transmission mode, system 22 transmits RF pulses via transmission channel 9 to initiate nuclear magnetic resonance in volume M. Specifically, system 22 processes respective RF echo pulses associated with a pulse sequence used by system computer 20 in conjunction with sequence controller 18 to provide a digitally represented numerical sequence of complex numbers. This numerical sequence is supplied as real and imaginary parts via digital-analog converter 12 in the high-frequency system 22 and from there to a transmission channel 9. In the transmission channel 9, the pulse sequences are modulated with a radio-frequency carrier signal, having a base frequency corresponding to the resonance frequency of the nuclear spins in the measurement volume M.

The conversion from transmitting to receiving operation is done via a multiplexer 6. RF coils 4 emit RF pulses to excite nuclear proton spins in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17. Imaging computer 17 reconstructs an image from the processed acquired RF echo pulse data. The processing of RF data, the image data and the control programs is performed under control of system computer 20. In response to predetermined pulse sequence control programs, sequence controller 18 controls generation of desired pulse sequences and corresponding scanning of k-space. In particular, sequence controller 18 controls the switching of the magnetic gradients at appropriate times, transmission of RF pulses with a determined phase and amplitude and reception of magnetic resonance signals in the form of RF echo data. Synthesizer 19 determines timing of operations of RF system 22 and sequence controller 18. The selection of appropriate control programs for generating an MR image and the display of the generated nuclear spin image is performed by a user via terminal (console) 21, which contains a keyboard and one or more screens. System 10 uses magnetic field gradients and radio frequency excitation to create an image. System computer 20 translates acquired k-space data onto a Cartesian grid and a Three-Dimensional Fourier Transform (3DFT) method is used to process the data to form a final image.

System computer 20 automatically (or in response to user command entered via terminal 21) employs and directs the MR imaging device of system 10 in processing an MR dataset to provide an MR signal generated by a group of protons having substantially the same proton spin precession angle. A computation processor in computer 20 determines phase angles of RF pulses for use in acquiring MR signal data of a desired coherence pathway in response to, predetermined data indicating a number of coherence pathways in multiple MR datasets to be acquired, predetermined information indicating different types of MR signals present in the multiple MR datasets to be acquired and at least one phase equation selected in response to a corresponding at least one type of the types of MR signals present in the MR datasets to be acquired. The number of coherence pathways represents a corresponding number of groups of protons having substantially the same proton spin precession angle. RF system 22 (an RF signal generator) generates RF pulses for acquiring multiple MR datasets including MR signal data of the desired coherence pathway using the determined phase angles. The MR imaging device of system 10 performs multiple MR scans to provide the multiple MR datasets using the generated RF pulses.

System 10 employs a phase rotation method to isolate signals in different coherence pathways, or to obtain a desired signal and suppress an unwanted signal in the corresponding pathways, in magnetic resonance (MR) imaging data, not just spectroscopy data. System 10 facilitates data acquisition and image reconstruction in stimulated echo acquisition, for example. A number of MR pulse sequences generate data of multiple coherence pathways. System 10 employs a phase cycling method for composing and solving a system of linear equations using the acquisition data and pre-calculated coefficients to isolate signals in multiple coherence pathways of MR data derived from multiple MR pulse sequences. In addition, in one embodiment a phase rotation method is used with stimulated echo MR data acquisition to provide convenient separation of coherence pathway signals without the need of solving linear equations.

System 10 performs phase cycling in data acquisition, and assembles linear equations that are solved to isolate signals in different coherence pathways with reduced constraints by identifying a phase angle for use in generating RF pulses to acquire MR signal data of a desired coherence pathway. In one embodiment, a phase rotation method for stimulated echo imaging processes the signals in different coherence pathways with one extra Fourier Transform instead of solving linear equations. This advantageously facilitates implementation because the Fourier Transform operation is performed in the MR data reconstruction anyway and extra functions are not required. Further, system 10 advantageously employs a particular phase rotation method for use in DENSE imaging that facilitates implementation of reconstruction of stimulated echo data by performing an extra Fourier transform, compared to known phase cycling methods typically involve a complex-weighted addition.

Theory.

Rotation about a General Axis with Arbitrary Phase Angle in Transverse Plane.

Analysis is performed of magnetization evolution affected by an RF pulse which is equivalent to a rotation about a general axis $z'_\theta$ by an angle $\alpha$. This axis $z'_\theta$ lies in the transverse plane (x-y plane) with an arbitrary phase angle $\theta$. A rotation specified by such a condition is described by a rotation matrix $$R_{z'_\theta}(\alpha) = R_z(-\theta) R_y(-90°) R_z(\alpha) R_y(90°) R_z(\theta) \qquad [1]$$

$R_z(\alpha)$ is the rotation matrix representing the rotation about the z-axis by an angle $\alpha$, which is given by $$R_z(\alpha) = \begin{bmatrix} \cos\alpha & \sin\alpha & 0 \\ -\sin\alpha & \cos\alpha & 0 \\ 0 & 0 & 1 \end{bmatrix} \qquad [2]$$

$R_y(\alpha)$ is the rotation matrix representing the rotation about the y-axis by an angle $\alpha$, which is given by $$R_y(\alpha) = \begin{bmatrix} \cos\alpha & 0 & -\sin\alpha \\ 0 & 1 & 0 \\ \sin\alpha & 0 & \cos\alpha \end{bmatrix} \qquad [3]$$

Equation [1] can be simplified as $$R_{z'_\theta}(\alpha) = \begin{bmatrix} \sin^2\theta\cos\alpha + \cos^2\theta & \sin\theta\cos\theta(1-\cos\alpha) & -\sin\theta\sin\alpha \\ \sin\theta\cos\theta(1-\cos\alpha) & \cos^2\theta\cos\alpha + \sin^2\theta & \cos\theta\sin\alpha \\ \sin\theta\sin\alpha & -\cos\theta\sin\alpha & \cos\alpha \end{bmatrix} \qquad [4]$$

Using Equation [4], special cases are analyzed which facilitates derivations in the next sections.

For a first case, the original magnetization has the z component only. Therefore, it is denoted as $$M_- = \begin{bmatrix} 0 \\ 0 \\ M_{z-} \end{bmatrix} \qquad [5]$$

where the subscript "−" means the time point just prior to the application of the RF pulse. After applying the RF pulse, the magnetization is given by $$M_+ = R_{z'_\theta}(\alpha)M_- = \begin{bmatrix} -M_{z-}\sin\theta\sin\alpha \\ M_{z-}\cos\theta\sin\alpha \\ M_{z-}\cos\alpha \end{bmatrix} \quad [6]$$

where the subscript "+" means the time point just after the application of the RF pulse. The longitudinal magnetization is expressed as $$M_{z+} = M_{z-}\cos\alpha \quad [7]$$

And the transverse magnetization is simplified as $$M_{xy+} = M_{z-}\sin\alpha \cdot e^{j(\theta + \frac{\pi}{2})} \quad [8]$$

For the second case, the original magnetization has the transverse component only. Therefore, it is denoted as $$M_- = \begin{bmatrix} M_{x-} \\ M_{y-} \\ 0 \end{bmatrix} = \begin{bmatrix} |M_{xy-}|\cos\theta_{xy-} \\ |M_{xy-}|\sin\theta_{xy-} \\ 0 \end{bmatrix} \quad [9]$$

After applying the RP pulse, the magnetization is given by $$M_+ = \quad [10]$$
$$R_{z'_\theta}(\alpha)M_- = \begin{bmatrix} (\sin^2\theta\cos\alpha + \cos^2\theta)M_{x-} + \sin\theta\cos\theta(1-\cos\alpha)M_{y-} \\ \sin\theta\cos\theta(1-\cos\alpha)M_{x-} + (\cos^2\theta\cos\alpha + \sin^2\theta)M_{y-} \\ \sin\theta\sin\alpha M_{x-} - \cos\theta\sin\alpha M_{y-} \end{bmatrix}$$

The longitudinal magnetization is simplified as $$M_{z+} = |M_{xy-}|\sin\alpha \sin(\theta - \theta_{xy-}) \quad [11]$$

And the transverse magnetization is simplified as $$M_{xy+} = |M_{xy-}|\left[(1-\cos\alpha)\sin(\theta - \theta_{xy-}) \cdot e^{j(\frac{\pi}{2}+\theta)} + e^{j\theta_{xy-}}\right] \quad [12]$$

If the RF pulse is a 180° pulse, then the transverse magnetization is further simplified as $$M_{xy+} = |M_{xy-}| \cdot e^{j(2\theta - \theta_{xy-})} \quad [13]$$

Signal Coherence Pathways and Their Phase Equations.

Figure 2:
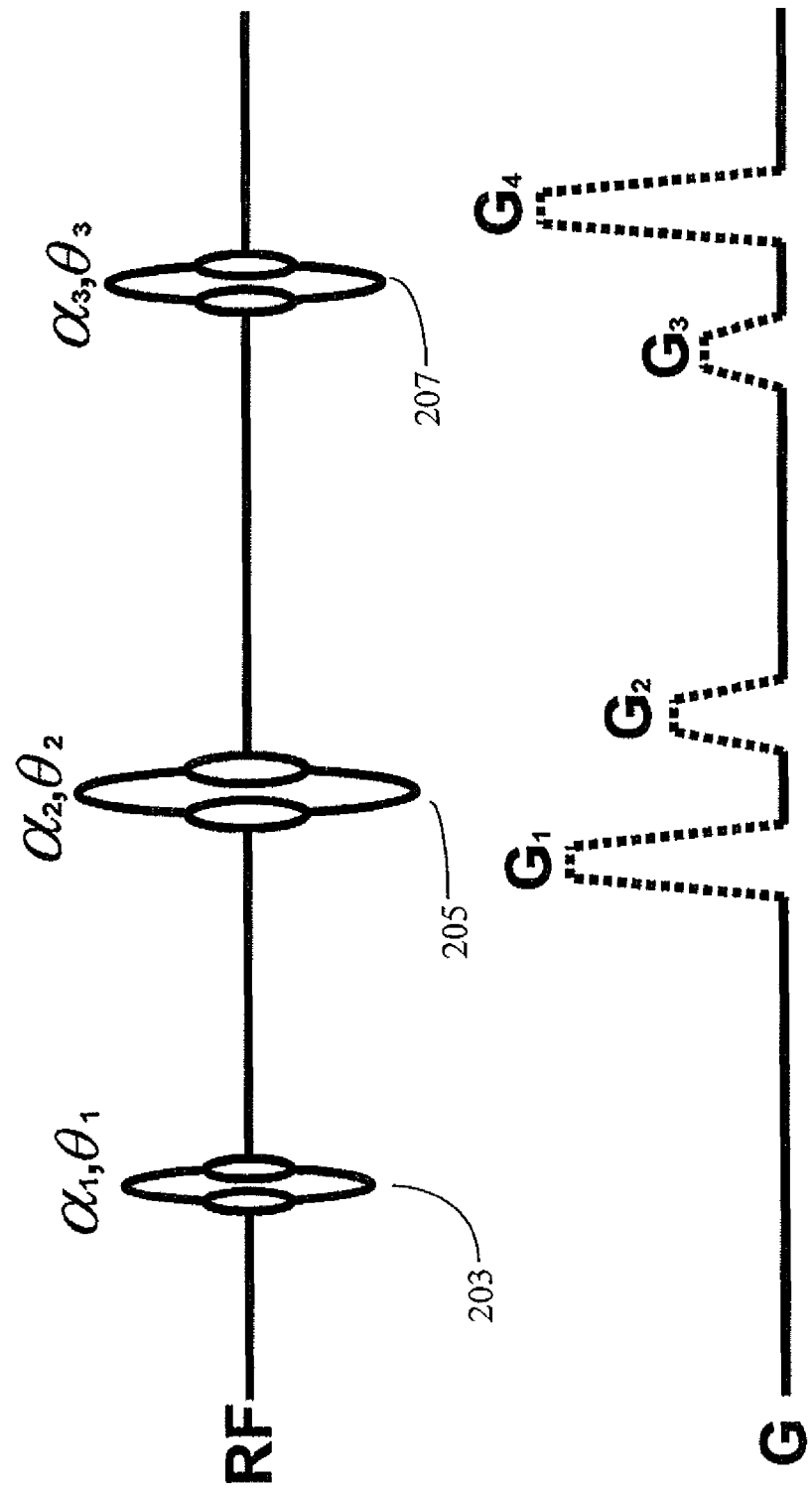
FIG. 2 shows timing of a three-pulse sequence indicating flip angles and phase angles of first, second and third RF pulses and momentum of gradients, according to invention principles.

FIG. 2 shows timing of a three-pulse sequence indicating flip angles and phase angles of first, second and third RF pulses and momentum of gradients. The three-pulse sequence timing is a widely used MR pulse sequence to prepare magnetization. First 203, second 205 and third 207 RF pulses provide proton flip angles $\alpha_1$, $\alpha_2$, $\alpha_3$, and phase angles $\theta_1$, $\theta_2$, and $\theta_3$, respectively. $G_1$, $G_2$, $G_3$ and $G_4$ comprise the momentum of magnetic gradients.

FIG. 3 shows a table employed by system 10 (FIG. 1) indicating different types of MR acquisition signals in column 303 in a three-pulse sequence and their corresponding phase equations derived in accordance with the previous analysis. In column 303, FID signals comprises 1D free induction decay signals, SE indicates spin echo signals, STEAM means stimulated echo signals, SEE means double spin echo signals which are the basis of a point resolved spectroscopy (PRESS) sequence, and DQF comprises double-quantum filtered echo. The column 305 parameters $\theta_1$, $\theta_2$ and $\theta_3$ correspond to the phases of the first, second and third RF pulses, respectively as illustrated in FIG. 2. The constant phase terms such as $\pi/2$ or $-\pi/2$ are ignored in the phase equations for simplicity, since these constant phase terms can be multiplied in the final resultant data easily to correct the phase difference and there is no need to carry them in the calculation of phase cycling or phase rotation.

Depending on different sequences, the role of the magnetic field gradients between any two RF pulses may comprise encoding gradients, spoiler gradients and/or crasher gradients. In different sequences, these gradients are set correspondingly, so that acquired MR data is composed of a minimal number of signals from different coherence pathways including the desired signal. For example, in a DENSE sequence, the typical configuration of the gradients retains only the signals of FID 3, STEAM N and STEAM P in the acquired data, and those three signals are termed as T1 echo, stimulated echo, and stimulated anti-echo (or complex conjugate echo) as DENSE terminologies. In other pulse sequences such as involving phase cycling or phase rotation the signals in different coherence pathways can be separated, however the gradients need to be set appropriately to eliminate unwanted signals in acquired data as much as possible. This is because using gradients to spoil unwanted signals reduces the number of signals to be processed by phase cycling or phase rotation, and reduces the number of phase cycling or phase rotation steps, so less scan time is required. Further, in practice, phase cycling or phase rotation may not suppress or isolate the signals perfectly because of inconsistent conditions such as motion during phase cycling or phase rotation steps. Appropriate gradient settings may help phase cycling or phase rotation achieve better results.

Generalized Phase Cycling Method

In accordance with FIG. 2 and the table of FIG. 3, the magnetization of one scan is $$M_{xy} = [E_1 \; E_2 \; \ldots \; E_n] \begin{bmatrix} S_1 \\ S_2 \\ \vdots \\ S_n \end{bmatrix} = \quad [14]$$

$$[e^{iP_1} \; e^{iP_2} \; \ldots \; e^{iP_n}] \begin{bmatrix} S_1 \\ S_2 \\ \vdots \\ S_n \end{bmatrix}$$

$M_{xy}$ is the transverse magnetization, or the direct data of one scan, n is the total number of signals in different coherence pathways existing in the current specific sequence, $S_j$ (j=1 ... n) is the jth signal in the corresponding jth coherence pathway, $E_j$ is the coefficient corresponding to $S_j$, $E_j$ equals exp($iP_j$), where $P_j$ is the phase equation corresponding to $S_j$ given by the phase equations in the table of FIG. 3.

Since there are n unknown variables ($S_1$ through $S_n$) to solve, at least n equations are needed. That means, m scans (m≥n), or phase cycling steps, are needed to solve the n signals in this sequence. This process can be expressed by $$\begin{bmatrix} M_{xy1} \\ M_{xy2} \\ \vdots \\ M_{xym} \end{bmatrix} = \begin{bmatrix} E_{11} & E_{12} & \ldots & E_{1n} \\ E_{21} & E_{22} & \ldots & E_{2n} \\ \vdots & \vdots & \ddots & \vdots \\ E_{m1} & E_{m2} & \ldots & E_{mn} \end{bmatrix} \begin{bmatrix} S_1 \\ S_2 \\ \vdots \\ S_n \end{bmatrix} = \quad [15]$$

$$\begin{bmatrix} e^{iP_{11}} & e^{iP_{12}} & \ldots & e^{iP_{1R}} \\ e^{iP_{21}} & e^{iP_{22}} & \ldots & e^{iP_{2n}} \\ \vdots & \vdots & \ddots & \vdots \\ e^{iP_{m1}} & e^{iP_{m2}} & \ldots & e^{iP_{mn}} \end{bmatrix} \begin{bmatrix} S_1 \\ S_2 \\ \vdots \\ S_n \end{bmatrix}$$

In order to solve $S_1$ through $S_n$, Equation [15] can be denoted as below for simplicity:

$$M = ES \quad [16]$$

The signals, including the desired and the unwanted signals, are given by $$S = (E^T E)^{-1} E^T M \quad [17]$$

where the superscript T denotes the matrix transpose operation, and the superscript −1 denotes the matrix inverse operation.

The phase angle of one or more of the RF pulses of FIG. 2 is varied for each scan or phase cycling step to make sure that the inverse matrix of $E^T E$, i.e. $(E^T E)^{-1}$, exists and to derive the signals. Three-point phase cycling is used by system 10 to isolate the signals in a DENSE sequence and is illustrated as follows. For consistency with DENSE terminologies, stimulated echo (STE), T1 echo (TIE), and complex conjugate echo (CCE) are used instead of STEAM N, FID 3 and STEAM P, respectively. As one example solution, the phase of the second RF pulse in the DENSE sequence is set as 0°, 120°, 240° for three scans, respectively. The transverse magnetization of these three scans is $$\begin{bmatrix} M_{xy1} \\ M_{xy2} \\ M_{xy3} \end{bmatrix} = \begin{bmatrix} 1 & 1 & 1 \\ e^{i\frac{2\pi}{3}} & e^{-i\frac{2\pi}{3}} & 1 \\ e^{i\frac{4\pi}{3}} & e^{-i\frac{4\pi}{3}} & 1 \end{bmatrix} \begin{bmatrix} STE \\ CCE \\ T1E \end{bmatrix} \quad [18]$$

And the signals are solved as $$\begin{bmatrix} STE \\ CCE \\ T1E \end{bmatrix} = \frac{1}{3} \begin{bmatrix} 1 & e^{-i\frac{2\pi}{3}} & e^{-i\frac{4\pi}{3}} \\ 1 & e^{i\frac{2\pi}{3}} & e^{i\frac{4\pi}{3}} \\ 1 & 1 & 1 \end{bmatrix} \begin{bmatrix} M_{xy1} \\ M_{xy2} \\ M_{xy3} \end{bmatrix} \quad [19]$$

Other embodiments use different methods to choose the phase of the RF pulses of each scan, as long as the inverse matrix of $E^T E$ exists. An arbitrary selection of the phase of the RF pulses of each scan may not be optimal to derive a desired signal due to reduced noise performance compared to a theoretical optimal method from a statistical perspective. It is preferred to perform more phase cycling scans than less, and to make the phase alternation of the RF pulse evenly dispersive with the range of 0 to $2\pi$, if possible.

A Phase Rotation Method for Stimulated Echo Sequences

In most stimulated echo sequences, the spoiler gradients or the crusher gradients are configured to substantially eliminate other unwanted signals. Therefore, usually there are three signals in the acquired data, including STEAM N, which is the desired signal, and FID 3 and STEAM P, which are the unwanted signals and need to be eliminated or separated by the phase cycling or phase rotation methods. Some example sequences include the DENSE imaging sequence and the STEAM single voxel spectroscopy sequence.

This phase rotation method is applied using DENSE imaging but is also applicable to STEAM single voxel spectroscopy.

It is advantageously recognized that the phase of STE and CCE are symmetric about the phase of T1E. STE, T1E and CCE are written in sequential order in S:

$$S = \begin{bmatrix} S_1 \\ S_2 \\ S_3 \end{bmatrix} = \begin{bmatrix} STE \\ T1E \\ CCE \end{bmatrix} \quad [20]$$

So there are three signals, or echoes in DENSE terminology, (n=3) in the DENSE data. A minimum of three scans (m=3) are needed to separate the three echoes in S. System 10 uses following equation to generate the E matrix $$E_{jk} = e^{-i2\pi(j-1)(k-1)/3} \ (j=1\ldots 3, k=1\ldots 3) \quad [21]$$

And substitute into Equation [15], to express the phase cycling process as $$\begin{bmatrix} M_{xy1} \\ M_{xy2} \\ M_{xy3} \end{bmatrix} = \begin{bmatrix} 1 & 1 & 1 \\ 1 & e^{-i\frac{2\pi}{3}} & e^{-i\frac{4\pi}{3}} \\ 1 & e^{-i\frac{4\pi}{3}} & e^{-i\frac{8\pi}{3}} \end{bmatrix} \begin{bmatrix} S_1 \\ S_2 \\ S_3 \end{bmatrix} \quad [22]$$

Solving the phase values of the RF pulses for each scan using the corresponding phase equations in the table of FIG. 3 and the coefficients in each row in matrix E, provides $$\begin{cases} \theta_{1\_1} = 0 \\ \theta_{2\_1} = 0 \\ \theta_{3\_1} = 0 \end{cases} \begin{cases} \theta_{1\_2} = -\frac{\pi}{3} \\ \theta_{2\_2} = \frac{\pi}{3} \\ \theta_{3\_2} = -\frac{2\pi}{3} \end{cases} \begin{cases} \theta_{1\_3} = -\frac{2\pi}{3} \\ \theta_{2\_3} = \frac{2\pi}{3} \\ \theta_{3\_3} = -\frac{4\pi}{3} \end{cases} \quad [23]$$

where $\theta_{l\_j}$ means the phase of the lth RF pulse in the jth phase cycling scan. If two functions, $F(j')$ and $f(k')$, are defined where $$F(j') = M_{xy(j'+1)} \ (j'=j-1=0\ldots 2) \quad [24]$$

$$f(k') = S_{(k'+1)} \ (k'=k-1=0\ldots 2) \quad [25]$$

then Equation [22] is $$F(j') = \sum_{k'=0}^{2} f(k') e^{-i2\pi j' k'/3} \ (j'=0\ldots 2) \quad [26]$$

This is the definition of discrete Fourier Transform (DFT). Therefore, we have $$F(j') = DFT\{f(k')\} \quad [27]$$

The echoes in DENSE data are obtained by solving $f(k')$ using an inverse discrete Fourier Transform (IDFT)

$$f(k') = IDFT\{F(j')\} \quad [28]$$

That is equivalent to $$f(k') = \frac{1}{3}\sum_{j'=0}^{2} F(j')e^{j2\pi k'j'/3} \quad (k' = 0 \ldots 2) \qquad [29]$$

System 10 performs this process for 2D DENSE imaging using a pulse sequence for three scans, where the corresponding phase values are determined for RE pulses in each scan as given in Equation [23]. Two three-dimensional (3D) matrices with the third dimension as the phase cycling dimension in the post-processing program are reserved for storing the acquired data and the data of different echoes, respectively. Alternatively one 3D matrix is used if it is acceptable to overwrite the acquired data. For each scan, one 2D DENSE dataset is acquired, and is put in the data storage matrix at the correct location corresponding to the current phase cycling scan index. After the data acquisition and storage of the phase cycling scans are finished, a Fourier Transform is performed in the phase cycling dimension, and the resultant 3D matrix contains the data corresponding to stimulated echo (STE), T1 echo (T1E) and complex conjugate echo (CCE) in the sequential order in the third dimension. Therefore, there is no need to assemble and solve the linear equations, and the data corresponding to the echoes are separated by an extra Fourier Transform, which is advantageously convenient. In another embodiment of system 10, the order of STE, T1E and CCE in the matrix S is reversed, so that the resultant STE data is not located on the first-index position in the third dimension, which might be contaminated by the direct-current (DC) noise. Further, if only STE data is needed to be observed, System 10 averages the data of the three phase cycling scans to yield the resultant STE data, which eliminates the need for this extra Fourier Transform in the phase cycling dimension.

Potentially more scans than the minimal number can be used for phase cycling. Although this rarely happens for DENSE imaging, it is a typical case for spectroscopy sequences, since multiple scans (up to 128 or more) are typically acquired for averaging signals to improve SNR are performed. The corresponding phase rotation method based on the DENSE imaging example is analyzed for spectroscopy sequences. If m scans (m>3) are used for phase cycling, zero padding needs to be performed when making the matrix S. There needs to be equal number of zeros between STE and T1E as well as between T1E and CCE, i.e.

$$S = \begin{bmatrix} S_1 \\ \vdots \\ S_m \end{bmatrix} = \begin{bmatrix} ZERO_{m_1} \\ STE \\ ZERO_{m_2} \\ T1E \\ ZERO_{m_2} \\ CCE \\ ZERO_{m_3} \end{bmatrix} \quad (m = m_1 + 2m_2 + m_3 + 3) \qquad [30]$$

where $ZERO_m$ (t=1 ... 3) is a zero matrix with the size of $m_1$-by-1, and any $ZERO_m$ could be void if needed. Then Equation [21] may be adapted to $$E_{jk} = e^{-i2\pi(j-1)(k-1)/m} \quad (j=1 \ldots m, k=1 \ldots m) \qquad [31]$$

And the phase cycling process can be expressed as $$\begin{bmatrix} M_{xy1} \\ M_{xy2} \\ \vdots \\ M_{xym} \end{bmatrix} = \begin{bmatrix} 1 & 1 & \ldots & 1 \\ 1 & e^{-i\frac{2\pi}{m}} & \ldots & e^{-i\frac{2(m-1)\pi}{m}} \\ \vdots & \vdots & \ddots & \vdots \\ 1 & e^{-i\frac{2(m-1)\pi}{m}} & \ldots & e^{-i\frac{2(m-1)^2\pi}{m}} \end{bmatrix} \begin{bmatrix} S_1 \\ S_2 \\ \vdots \\ S_m \end{bmatrix} \qquad [32]$$

The phase values of the RF pulses for each scan may be solved using the corresponding phase equations in the table of FIG. 3 and the coefficients in each row in matrix E, provides $$\begin{cases} \theta_{1\_1} = 0 \\ \theta_{2\_1} = 0 \\ \theta_{3\_1} = 0 \end{cases} \begin{cases} \theta_{1\_2} = -\frac{\pi}{m} \\ \theta_{2\_2} = \frac{\pi}{m} \\ \theta_{3\_2} = -\frac{2\pi}{m} \end{cases} \begin{cases} \theta_{1\_m} = -\frac{(m-1)\pi}{m} \\ \theta_{2\_m} = \frac{(m-1)\pi}{m} \\ \theta_{3\_m} = -\frac{2(m-1)\pi}{m} \end{cases} \qquad [33]$$

The Equation [26] and Equation [29] are adapted as $$F(j') = \sum_{k'=0}^{m-1} f(k')e^{-i2\pi j'k'/m} \quad (j' = 0 \ldots m-1) \qquad [34]$$

$$f(k') = \frac{1}{m}\sum_{j'=0}^{m-1} F(j')e^{i2\pi k'j'/m} \quad (k' = 0 \ldots m-1) \qquad [35]$$

Therefore, as long as the corresponding phase values are set for the RF pulses in each scan as given in Equation [33], and the acquired data of each scan is stored sequentially in the 3D data-storage matrix in the phase cycling dimension, a 1D Fourier Transform in the phase cycling dimension can separate the echoes in the third dimension in the resultant 3D data matrix, with the index of $(m_1+1)$ corresponding to the STE data, the index of $(m_1+m_2+2)$ corresponding to the T1E data, and the index of $(m_1+2m_2+3)$ corresponding to the CCE data.

In another case, two phase cycling scans (m=2) are performed even though there are three echoes to separate. This is a practical case in DENSE imaging, as the scan time is often limited by the breath-hold duration. In this situation, the symmetric nature of STE and CCE about T1E is advantageously used. If the same method is used to perform phase cycling on the RF pulses, the phase values of the RF pulses for each scan are $$\begin{cases} \theta_{1\_1} = 0 \\ \theta_{2\_1} = 0 \\ \theta_{3\_1} = 0 \end{cases} \begin{cases} \theta_{1\_2} = -\frac{\pi}{2} \\ \theta_{2\_2} = \frac{\pi}{2} \\ \theta_{3\_2} = -\pi \end{cases} \qquad [36]$$

This yields the phase cycling process as described by $$\begin{bmatrix} M_{xy1} \\ M_{xy2} \end{bmatrix} = \begin{bmatrix} 1 & 1 & 1 \\ 1 & e^{-i\pi} & e^{-i2\pi} \end{bmatrix} \begin{bmatrix} STE \\ T1E \\ CCE \end{bmatrix} = \begin{bmatrix} 1 & 1 \\ 1 & e^{-i\pi} \end{bmatrix} \begin{bmatrix} STE + CCE \\ T1E \end{bmatrix} \qquad [37]$$

Therefore, the same phase rotation method can be used, but the CCE is not able to be separated from the STE. This is the same performance as applying the method of complementary spatial modulation of magnetization (CSPAMM), which is actually a two-point phase cycling, in the DENSE imaging. To further suppress the CCE in the resultant data which is the sum of the STE and the CCE, the strengths of $G_1$ and $G_4$ gradients are increased to an appropriate amount, and this makes the signal peak of the CCE in k-space move out of the sampling region so as to eliminate the CCE. The phase rotation method in this section can be extended to the general N-dimensional cases, such as 1D for STEAM single-voxel spectroscopy, and 2D/3D for DENSE imaging.

System 10 separates signals in different coherence pathways, or obtains desired signals and suppresses unwanted signals in corresponding pathways, in magnetic resonance (MR) data. In one embodiment, system 10 lists the n signals that exist in the acquired data of a pulse sequence of interest and processes them in a matrix (signal matrix). System 10 performs in imaging scans (m≧n) to acquire the data, where for each scan the phase angle(s) of one or all of the RF pulses in the sequences are varied and system 10 puts the acquired data of each scan sequentially in a matrix (scan matrix). System 10 uses the phase angles of the RF pulses in each scan to calculate the phase that is carried to each echo in different coherence pathways, and calculates the coefficients of the corresponding signals based on the carried phase values and puts them into a coefficient matrix. System 10 forms an equation using the scan matrix, coefficient matrix and signal matrix and solves the equation by calculating a closed form of solution equation to obtain the values of the components in the signal matrix. The phase rotation is used in MR sequences to separate signals in different coherence pathways for imaging data, instead of just for spectroscopy data.

System 10 employs a phase rotation method to separate signals in different coherence pathways in MR data by listing the n signals that exist in the MR data acquired using a pulse sequence of interest. System 10 puts the n signals in a matrix (signal matrix), and performs appropriate adjustment to the signal matrix to make the length of the signal matrix equal the number of scans m and calculates the coefficients of the corresponding signals based on a Fourier Transform coefficient equation and puts them into a coefficient matrix. System 10 determines the phase values of the RF pulses for each scan based on the phase equations of the signal in different coherence pathways and the coefficients in the coefficient matrix. System 10 performs m scans to acquire the data, where for each scan the phase angle(s) of the RF pulses are varied based on the calculated phase values. System 10 puts the acquired data of each scan sequentially in a matrix (scan matrix) having a last dimension comprising a phase cycling dimension and performs a 1D Fourier Transform on the scan matrix in the phase cycling direction to obtain the values of the components in the signal matrix.

Figure 4:
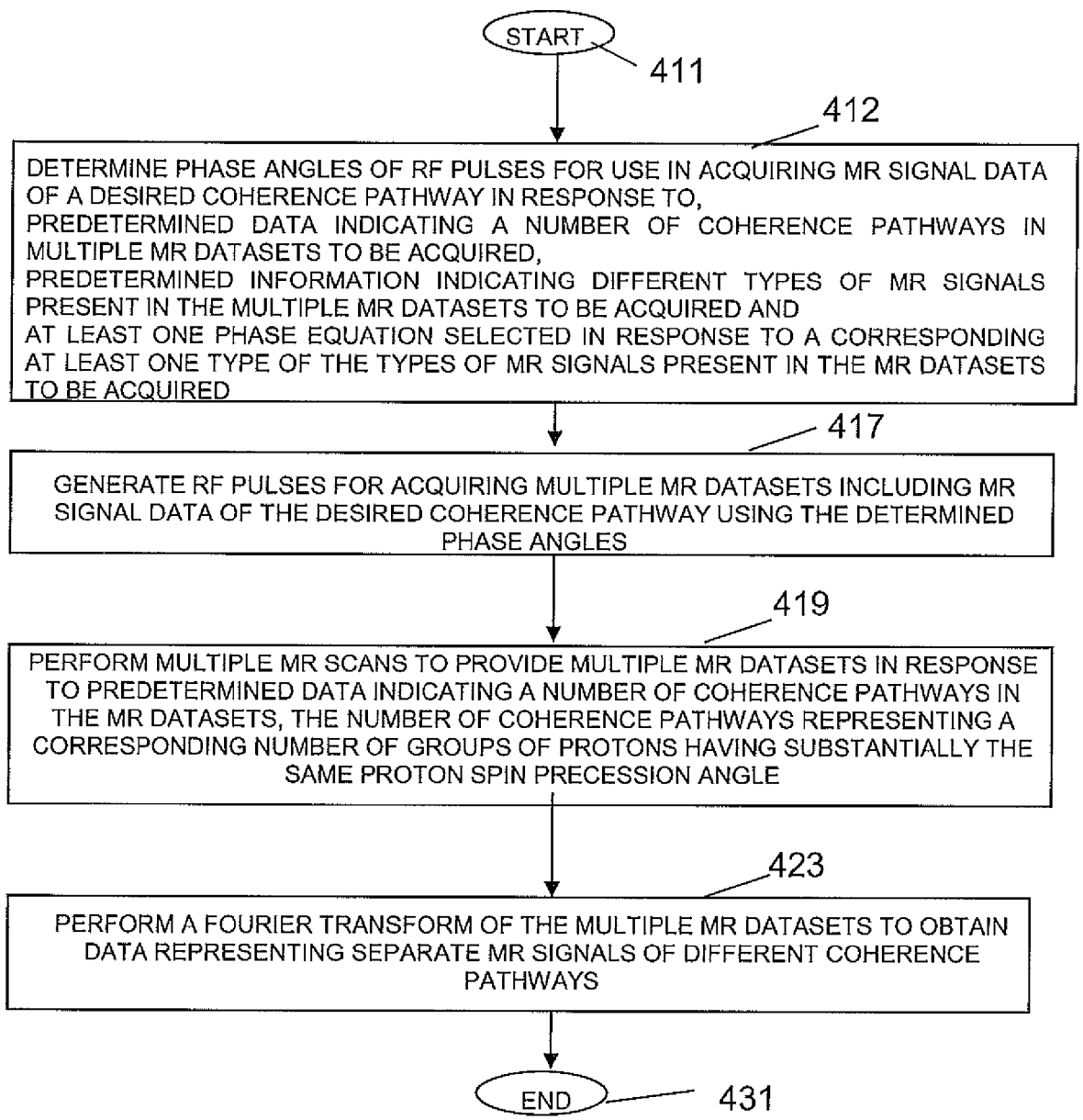
FIG. 4 shows a flowchart of a process performed by a system for processing an MR dataset to provide an MR signal generated by a group of protons having substantially the same proton spin precession angle, according to invention principles.

FIG. 4 shows a flowchart of a process performed by system 10 for processing an MR dataset to provide an MR signal generated by a group of protons having substantially the same proton spin precession angle. In step 412 a computation processor in computer 20 determines phase angles of RF pulses for use in acquiring MR signal data of a desired coherence pathway in response to, predetermined data indicating a number of coherence pathways in multiple MR datasets to be acquired, predetermined information indicating different types of MR signals present in the multiple MR datasets to be acquired and at least one phase equation selected in response to a corresponding at least one type of the types of MR signals present in the MR datasets to be acquired. The number of coherence pathways represent a corresponding number of groups of protons having substantially the same proton spin precession angle. The computation processor determines phase angles of RF pulse sequences used to acquire the MR datasets associated with different coherence pathways indicated by the predetermined information indicating different types of MR signals present in the acquired MR datasets.

The computation processor determines the phase angles by solving multiple linear simultaneous equations formed using predetermined information indicating different types of MR signals present in the acquired MR datasets. In one embodiment, the computation processor determines the phase angles based on a function of the form, $$M=ES$$

where M is a matrix representing transverse magnetization corresponding to the acquired MR datasets, E is a coefficient matrix representing coefficients corresponding to different coherence pathways identified in matrix S. The computation processor determines the minimum number of the multiple MR scans in response to the predetermined information indicating the different types of MR signals present in the multiple MR datasets to be acquired and the number of the multiple MR scans equals or exceeds the number of coherence pathways.

In one embodiment, the computation processor uses a linear equation method provided it is determined that selected phase angles of RF pulses yield an existing function $(E^T E)^{-1}$. In another embodiment a special phase rotation method (a special case of the linear equation method) is used employing a Fourier Transform. In the special phase rotation method the selection of the phase angle of RF pulses uses a method previously described involving listing n signals that exist in acquired MR data of the sequence of interest and that need to be separated. The n signals are placed in a matrix (signal matrix S), and adjustments are made to the signal matrix to make the length of the signal matrix equal the number of scans in (equation 30). The coefficients of the corresponding signals are calculated based on the Fourier Transform coefficient equation (equation 31) and placed in a coefficient matrix E and the phase angle of the RF pulses for individual scans are calculated using E and the phase equations in the table in FIG. 3.

In step 417 RF system 22 (an RF signal generator in the MR imaging device) generates RF pulses for acquiring multiple MR datasets including MR signal data of the desired coherence pathway using the determined phase angles. In step 419 the MR imaging device of system 10 performs multiple MR scans to provide the multiple MR datasets using the generated RF pulses. A data processor in computer 20 processes the multiple MR datasets to provide the MR signal data of the desired coherence pathway. The data processor obtains data representing separate MR signals of the different coherence pathways by solving multiple linear simultaneous equations formed using derived phase angles of the acquired MR datasets associated with different coherence pathways indicated by the predetermined information indicating different types of MR signals present in the acquired MR datasets. In step 423 computer 20 performs a Fourier Transform of the multiple MR datasets to obtain data representing separate MR signals of different coherence pathways. Computer 20 adaptively performs a linear equation method or special phase rotation method using a Fourier Transform on the multiple MR datasets, to obtain data representing separate MR signals of different coherence pathways. Computer 20 selects a linear equation method or special phase rotation in accordance with the selected phase angle determination method employed by the computation processor.

In one embodiment, the linear equation method is used to separate signals in different coherence pathways, by listing the n signals that exist in the acquired data of a sequence of interest and that need to be separated and by placing them in a matrix (the signal matrix S in equation 16). The acquired data of m scans is placed sequentially in a matrix (the scan matrix M in equation 16) and the phase angles of the RF pulses in each scan are used to calculate the phase that is carried to each echo in different coherence pathways. The coefficients of the corresponding signals are calculated based on the carried phase values and placed into the coefficient matrix (E in equation 16). Equation 16 is formed using the scan matrix M, coefficient matrix E and signal matrix S and solved by calculating the closed form of solution equation (equation 17) to obtain the values of the components in the signal matrix ($S_1$ through $S_n$).

In one embodiment, the phase rotation method is used to separate signals in different coherence pathways, by placing acquired data of m scans sequentially in a data storage matrix, in which the first one or two dimensions are the real data dimensions, and last dimension is the phase cycling dimension. A 1D Fourier Transform is performed on the scan matrix in the phase cycling dimension to obtain the values of the components in the signal matrix ($S_1$ through $S_n$). The process of FIG. 4 terminates at step 431.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a controller or microprocessor, for example, and is conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A user interface (UI), as used herein, comprises one or more display images, generated by a user interface processor and enabling user interaction with a processor or other device and associated data acquisition and processing functions.

The UI also includes an executable procedure or executable application. The executable procedure or executable application conditions the user interface processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

The system and processes of FIGS. 1-4 are not exclusive. Other systems and processes may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. A system provides phase cycling to separate MR signals in different coherence pathways without contamination, and to isolate signals in other coherence pathways and in one embodiment the system provides phase cycling without the need to solve linear equations. Further, the processes and applications may, in alternative embodiments, be located on one or more (e.g., distributed) processing devices on a network linking the units of FIG. 1. Any of the functions, image controls and steps provided in FIGS. 1-4 may be implemented in whole or in part in hardware, software or a combination of both.

What is claimed is:

1. A system for processing an MR dataset to provide an MR signal generated by a group of protons having substantially the same proton spin precession angle, comprising:
   a computation processor for determining phase angles of RF pulses for use in acquiring MR signal data of a desired coherence pathway, in response to predetermined data, predetermined information and at least one phase equation,
      said predetermined data indicating a number of coherence pathways in a plurality of MR datasets to be acquired, said number of coherence pathways representing a corresponding number of groups of protons having substantially the same proton spin precession angle,
      said predetermined information indicating different types of MR signals present in said plurality of MR datasets to be acquired and
      said at least one phase equation being selected in response to a corresponding at least one type of said types of MR signals present in said MR datasets to be acquired;
   an RF signal generator for generating RF pulses for acquiring a plurality of MR datasets including said MR signal data of said desired coherence pathway using the determined phase angles; and
   an MR imaging device for performing a plurality of MR scans to acquire said plurality of MR datasets including said MR signal data using the generated RF pulses.

2. A system according to claim 1, including
   a data processor for processing said plurality of MR datasets to provide said MR signal data of said desired coherence pathway wherein said data processor reconstructs an image using said plurality of MR datasets.

3. A system according to claim 1, wherein
said computation processor determines the minimum number of said plurality of MR scans in response to said predetermined information indicating the different types of MR signals present in said plurality of MR datasets to be acquired.

4. A system according to claim 3, wherein
said number of said plurality of MR scans equals or exceeds said number of coherence pathways.

5. A system according to claim 1, wherein
said computation processor determines said phase angles by solving a plurality of linear simultaneous equations formed using predetermined information indicating different types of MR signals present in the acquired MR datasets.

6. A system according to claim 5, wherein
said computation processor determines said phase angles based on a function of the form, $$M = ES$$

where M is a matrix representing transverse magnetization, E is a coefficient matrix representing coefficients corresponding to different coherence pathways identified in matrix S.

7. A system according to claim 1, wherein
said computation processor determines phase angles of RF pulse sequences used to acquire the MR datasets associated with different coherence pathways indicated by said predetermined information indicating different types of MR signals present in the acquired MR datasets.

8. A system according to claim 1, wherein
said RF signal generator is in said MR imaging device.

9. A system according to claim 1, including
a data processor for performing a Fourier Transform of the plurality of MR datasets to obtain data representing separate MR signals of said different coherence pathways.

10. A system according to claim 1, including
a data processor for obtaining data representing separate MR signals of said different coherence pathways by solving a plurality of linear simultaneous equations formed using derived phase angles of the acquired MR datasets associated with different coherence pathways indicated by said predetermined information indicating different types of MR signals present in the acquired MR datasets.

11. A system for processing an MR dataset to separate MR signals generated by groups of protons having substantially different proton spin precession angles, comprising:
a computation processor for determining a plurality of phase angles of RF pulse sequences for use in acquiring MR signal data of a corresponding plurality of different coherence pathways, in response to predetermined data, predetermined information and at least one phase equation,
said predetermined data indicating a number of coherence pathways in a plurality of MR datasets to be acquired, said number of coherence pathways representing a corresponding number of groups of protons having substantially the same proton spin precession angle,
said predetermined information indicating different types of MR signals present in said plurality of MR datasets to be acquired and
said at least one phase equation being selected in response to a corresponding at least one type of said types of MR signals present in said MR datasets to be acquired;
an MR imaging device for performing a plurality of MR scans to provide a plurality of MR datasets in response to the determined plurality of phase angles of RF pulse sequences; and
a data processor for performing a Fourier Transform of the plurality of MR datasets to obtain data representing separate MR signals of said different coherence pathways.

12. A system according to claim 11, wherein
said data processor processes said plurality of MR datasets to provide said MR signal data of said desired coherence pathway wherein
said data processor reconstructs an image using said plurality of MR datasets.

13. A method for processing an MR dataset to provide an MR signal generated by a group of protons having substantially the same proton spin precession angle, comprising the activities of:
employing an imaging device and at least one computer for,
determining phase angles of RF pulses for use in acquiring MR signal data of a desired coherence pathway, in response to predetermined data, predetermined information and at least one phase equation,
said predetermined data indicating a number of coherence pathways in a plurality of MR datasets to be acquired, said number of coherence pathways representing a corresponding number of groups of protons having substantially the same proton spin precession angle,
said predetermined information indicating different types of MR signals present in said plurality of MR datasets to be acquired and
said at least one phase equation being selected in response to a corresponding at least one type of said types of MR signals present in said MR datasets to be acquired;
generating RF pulses for acquiring a plurality of MR datasets including MR signal data of said desired coherence pathway using the determined phase angles; and
performing a plurality of MR scans to acquire said plurality of MR datasets including said MR signal data using the generated RF pulses.

14. A method according to claim 13, including the activities of
determining the minimum number of said plurality of MR scans in response to said predetermined information indicating the different types of MR signals present in said plurality of MR datasets to be acquired and
reconstructing an image using said plurality of MR datasets.

15. A method according to claim 14, wherein
said number of said plurality of MR scans equals or exceeds said number of coherence pathways.

16. A method according to claim 13, including the activity of
determining said phase angles by solving a plurality of linear simultaneous equations formed using predetermined information indicating different types of MR signals present in the acquired MR datasets.

17. A method according to claim 13, including the activity of
determining phase angles of RF pulse sequences used to acquire the MR datasets associated with different coherence pathways indicated by said predetermined information indicating different types of MR signals present in the acquired MR datasets.

18. A method according to claim 13, including the activity of
performing a Fourier Transform of the plurality of MR datasets to obtain data representing separate MR signals of said different coherence pathways.

19. A method according to claim 13, including the activity of
obtaining data representing separate MR signals of said different coherence pathways by solving a plurality of linear simultaneous equations formed using derived phase angles of the acquired MR datasets associated with different coherence pathways indicated by said predetermined information indicating different types of MR signals present in the acquired MR datasets.

20. A method according to claim 13, including the activity of
processing said plurality of MR datasets to provide said MR signal data of said desired coherence pathway.

* * * * *